(12) United States Patent
McNutt et al.

(10) Patent No.: US 7,719,055 B1
(45) Date of Patent: May 18, 2010

(54) CASCODE POWER SWITCH TOPOLOGIES

(75) Inventors: Ty R. McNutt, Columbia, MD (US);
John V. Reichl, Ellicott City, MD (US);
Harold C. Heame, III, Baltimore, MD (US); Eric J. Stewart, Silver Spring, MD (US); Stephen D. Van Campen, Clarksville, MD (US); Victor D. Veliadis, Hanover, MD (US)

(73) Assignee: Northrop Grumman Systems Corporation, Los Angeles, CA (US)

( * ) Notice: Subject to any disclaimer, the term of this patent is extended or adjusted under 35 U.S.C. 154(b) by 0 days.

(21) Appl. No.: 11/798,150

(22) Filed: May 10, 2007

(51) Int. Cl.
*H01L 31/062* (2006.01)

(52) U.S. Cl. .................. 257/341; 257/287; 257/280; 257/E29.149

(58) Field of Classification Search ......... 257/268–270, 257/280–287, 341, E29.149
See application file for complete search history.

(56) References Cited

U.S. PATENT DOCUMENTS

| 6,133,764 | A | * | 10/2000 | Griffith et al. ............... 327/65 |
| 2006/0113593 | A1 | * | 6/2006 | Sankin et al. ............... 257/341 |
| 2008/0179637 | A1 | * | 7/2008 | Henning et al. ............. 257/280 |

* cited by examiner

*Primary Examiner*—Dung A. Le
(74) *Attorney, Agent, or Firm*—Andrews Kurth LLP

(57) ABSTRACT

A normally-off cascode power switch circuit is disclosed fabricated in wide bandgap semiconductor material such as silicon carbide or gallium nitride and which is capable of conducting current in the forward and reverse direction under the influence of a positive gate bias. The switch includes cascoded junction field effect transistors (JFETs) that enable increased gain, and hence blocking voltage, while minimizing specific on-resistance.

14 Claims, 7 Drawing Sheets

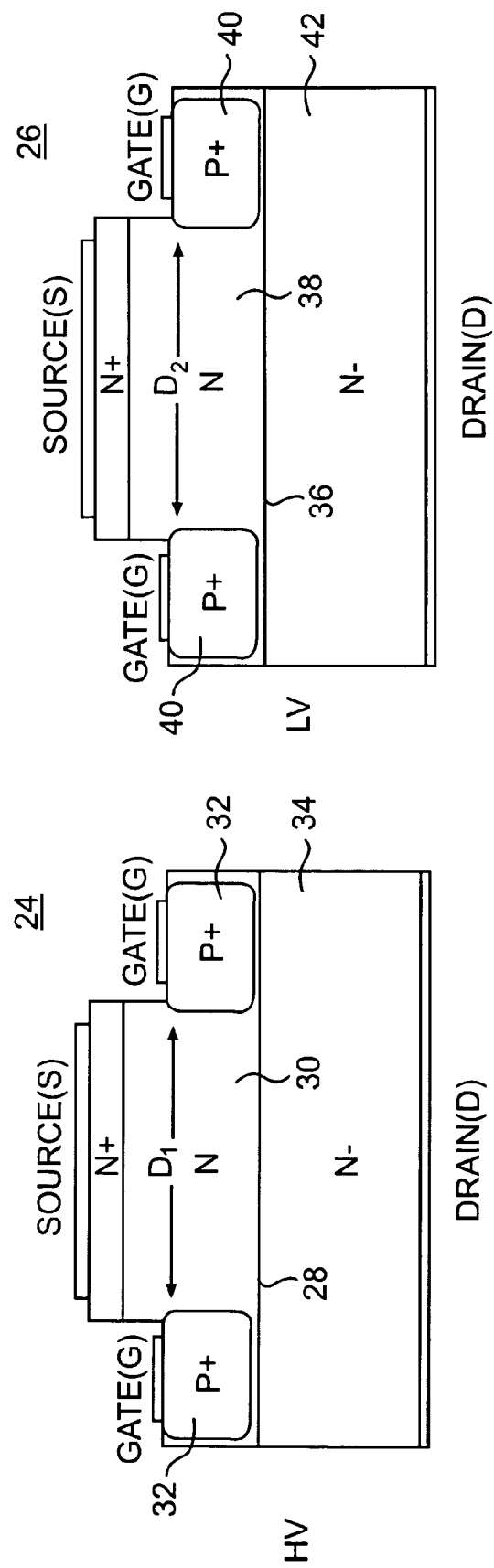

CASCODE POWER SWITCH TOPOLOGIES

BACKGROUND OF THE INVENTION

1. Field of the Invention

This invention relates generally to semiconductor power switches and more particularly to a normally-off cascode power switch fabricated in wide bandgap semiconductor material, such as silicon carbide or gallium nitride.

2. Description of the Prior Art

Semiconductor power switches are generally well known in the art and comprise many types of circuit configurations, one of which is the cascode power switch. One such power switch is known to include a normally-on (depletion mode) conducting junction gated transistor (e.g., the junction field effect transistor (JFET), static induction transistor (SIT), or metal semiconductor field effect transistor (MESFET)) as the high-voltage device connected in cascode circuit relationship with a normally-off (enhancement mode) non-conducting metal oxide semiconductor field effect transistor (MOSFET) as the low-voltage device. The normally-off low voltage device is designed to block approximately 20V to 50V, thus providing sufficient reverse gate-source bias on the high voltage normally-on device to promote current pinch-off. An arrangement using a normally-off silicon MOSFET as a control device, however, cannot operate at relatively high operating temperatures, for example in the range of 125° C. which greatly restricts the design parameters in systems such as modern high power motor drivers, directed energy weapon systems and power supply switching and conversion systems.

SUMMARY

Accordingly, it is an object of the present invention to provide a cascode power switch which is capable of operating at higher temperatures than can be achieved using silicon-based metal-oxide semiconductor field effect (MOSFET) devices.

It is a further object of the present invention to provide a cascode power switch which operates with increased blocking voltage and decreased specific on-resistance.

These and other objects are achieved by a cascode power switch fabricated exclusively in wide bandgap semiconductor material, e.g., silicon carbide (SiC), gallium nitride (GaN) or diamond, and is comprised of vertical JFET or SIT devices which are capable of conducting current in the forward and reverse direction under the influence of a positive gate bias. The all-SiC cascode switch is capable of operating at higher temperatures and increased power densities than can be achieved by silicon-based metal oxide semiconductor field effect transistor (MOSFET) technology.

In a first aspect of the invention, there is provided a cascode circuit power switch comprised of a normally-on (depletion mode), high voltage silicon carbide (SiC) or gallium nitride (GaN) vertical junction field effect transistor (JFET) or static induction transistor (SIT) and a normally-off (enhancement mode), low voltage silicon carbide or gallium nitride JFET or SIT.

In a second aspect of the invention, there is provided a cascode power switch comprised of a normally-on high voltage JFET or SIT and a normally-off low voltage JFET, or SIT and wherein the gate electrodes of the low voltage and high voltage devices are tied together.

In a third aspect of the invention, there is provided a cascode power switch including a normally-on high voltage JFET or SIT and a normally-off low voltage JFET or SIT, and wherein the gate electrodes are tied together, but now also includes the addition of a diode in the gate terminal of the high voltage JFET or SIT.

Further scope of applicability of the present invention will become apparent from the detailed description provided hereinafter. It should be understood, however, that the detailed description and specific examples, indicating preferred embodiments of the invention, are given by way of illustration only. Accordingly, various changes and modifications within the spirit and scope of the invention will become apparent to those skilled in the art from the following detailed description.

BRIEF DESCRIPTION OF THE DRAWINGS

The present invention will become more fully understood from the detailed description of the invention provided herein and the accompanying drawings, which are provided by way of illustration only, and thus are not meant to be considered in a limiting sense, and wherein:

FIGS. 3A and 3B depict central cross-sectional views of high voltage (HV) and low voltage (LV) silicon carbide vertical junction field effect transistors, respectively, utilized in the embodiment of the subject invention shown in FIG. 2;

DETAILED DESCRIPTION OF THE INVENTION

Currently, the most popular power FET is the N-channel silicon-metal oxide semiconductor field effect transistor (MOSFET). Such a device can conduct in the forward and reverse directions when a positive gate bias is applied with respect to the source terminal. Accordingly, it can be used to switch synchronously, i.e., can commutate inductor current, for example, during free wheel periods in inverter applications, thus drastically reducing the usage of the anti-parallel diode and the reverse recovery current and switching losses associated with it.

The silicon MOSFET, however, has an inherent limitation due to the material from which it is fabricated in that the switch can only be operated at less than 0.7V at room temperature 25° C. and thereafter decreasing by 2 mV for every 1° C. increase in temperature for silicon in the reverse direction before an internal pn junction diode turns on. Once the internal diode turns on, a stored charge is built up in a voltage blocking layer, resulting in reverse recovery currents and increasing switching losses. A wide bandgap device, e.g., a silicon carbide (SiC) device, such as a junction gated transistor, (e.g., junction field effect transistor (JFET), static induction transistor (SIT), or metal semiconductor field effect transistor (MESFET)), on the other hand, provides a greater forward voltage drop across the device before the internal diode turns ON, due to the fact that, for example, a SiC pn junction diode turns on for voltage greater than approximately 2.5V. It is also possible for the control junction to be formed by a Schottky junction where, for example, a SiC device with a nickel Schottky junction diode turns on for voltage greater than approximately 1.2 V.

A JFET consists of a field effect device having a relatively long channel of semiconductor material. The semiconductor material of the channel is doped so that it contains an abundance of positive charge carriers (p-type), or of negative charge carriers (n-type). There is an electrode at each end connected to a source and a drain semiconductor region. A third control electrode is connected to the gate semiconductor region. The gate region can be developed in the channel and is doped opposite to the doping-type of the channel. With respect to a SIT, it can be thought of as simply comprising a short channel JFET.

Figure 1:
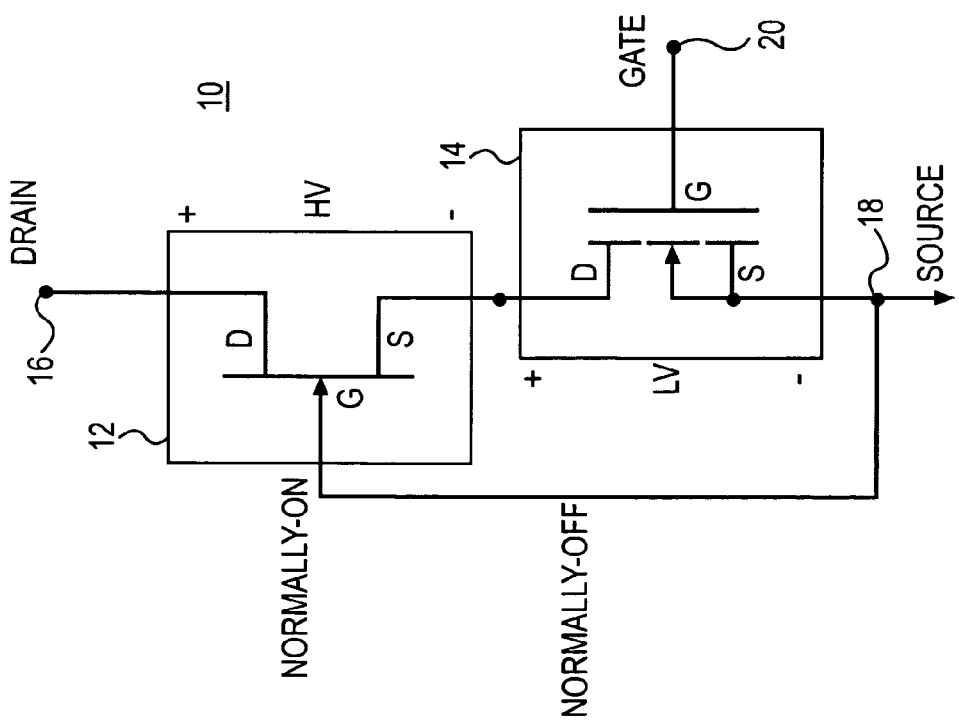
FIG. 1 is a schematic diagram illustrative of a cascode power switch in accordance with the known prior art.

Referring now to the drawings wherein like reference numerals refer to like elements throughout, FIG. 1 is illustrative of a conventional prior art cascode power switch 10 consisting of a high voltage (HV) vertical JFET device 12 connected in cascode circuit relationship with a low voltage (LV) silicon MOSFET 14. The JFET device 12 is typically fabricated in silicon or, when desirable, silicon carbide, and is considered a normally-on device, i.e., depletion mode device. The MOSFET device 14, on the other hand, is typically comprised of silicon and is considered a normally-off device, i.e., enhancement mode device. As shown, the drain electrode D of the high voltage JFET device 12 is connected to a circuit drain terminal 16. The gate electrode G of JFET 12 and the source electrode S of MOSFET 14 are commonly connected to a circuit source terminal 18. The source electrode S of JFET 12 is directly connected to the drain electrode D of MOSFET 14 and the gate electrode G of MOSFET 14 is connected to a circuit gate terminal 20.

When a positive gate bias voltage is applied to the gate terminal 20, MOSFET 14 becomes conductive and current can flow either in a forward or reverse direction through the cascode pair of devices 12 and 14. However, as noted above where the normally-off MOSFET 14 is comprised of silicon, the power switch 10 can only be operated at less than 0.7 volts in the reverse direction (current flow is from source to drain). This imposes a severe limitation on the cascode circuit combination which is undesirable in high temperature, high power operating environments.

Figure 2:
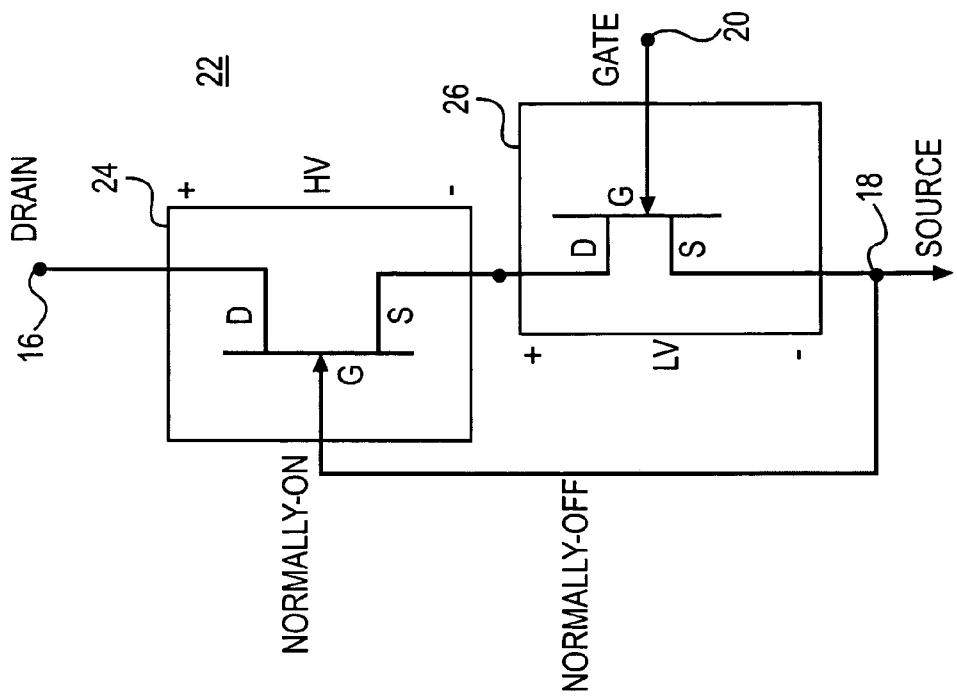
FIG. 2 is an electrical schematic diagram of a cascode power switch fabricated in wide bandgap semiconductor material in accordance with a preferred embodiment of the subject invention.

Referring now to FIG. 2, shown thereat is a cascode power switch 22 in accordance with a preferred embodiment of the subject invention now including a pair of vertical JFETs 24 and 26, both of which are fabricated from wide bandgap semiconductor material such as silicon carbide (SiC) or gallium nitride (GaN). The upper JFET 24 comprises a high voltage (HV) normally-on vertical JFET while the lower JFET 26 comprises a low voltage (LV) normally-off JFET.

For illustrative purposes, FIGS. 3A and 3B depict possible embodiments of normally-on and normally-off JFET devices, respectively. FIG. 3A is illustrative of the cross section of one embodiment of a normally-on high voltage (HV) JFET 24, while FIG. 3B is illustrative of the cross section of one embodiment of a normally-off low voltage (LV) JFET 26. What is intended to be shown thereat is that there exists a spacing of width $d_1$ of the gate-to-gate spacing and the doping in the N channel layer 28 of JFET 24 is such that the depletion regions 30 extending out from P+ gate regions 32 encircle the gate electrodes G and can extend into the N-drift region 34, and merge at zero gate bias, whereas the width $d_2$ of the gate-to-gate spacing and the doping in the N channel layer 36 of JFET 26 is such that the depletion region 38 extending out from P+ gate region 40 encircle the gate electrodes G and can extend into the N-drift region 42 yet do not merge at zero gate bias. This results from the relatively wider dimension of the P+ gate region 40 of JFET 26 as shown in FIG. 3B.

With respect to both JFET devices 24 and 26 shown in FIGS. 3A and 3B, integral pn junction diodes are formed between the P+ gate regions 32 and 40 and N-drift regions 34 and 42. It is significant to note that the wide bandgap semiconductor material (e.g., SiC, GaN, or diamond) of the normally-off JFET 26 results in a relatively higher turn-on voltage, ~2.5 volts, as opposed to ~0.7 volts for a silicon device such as MOSFET 12. This allows for a more robust use of a power switch, such as the cascode power switch shown in FIG. 2.

Figure 4:
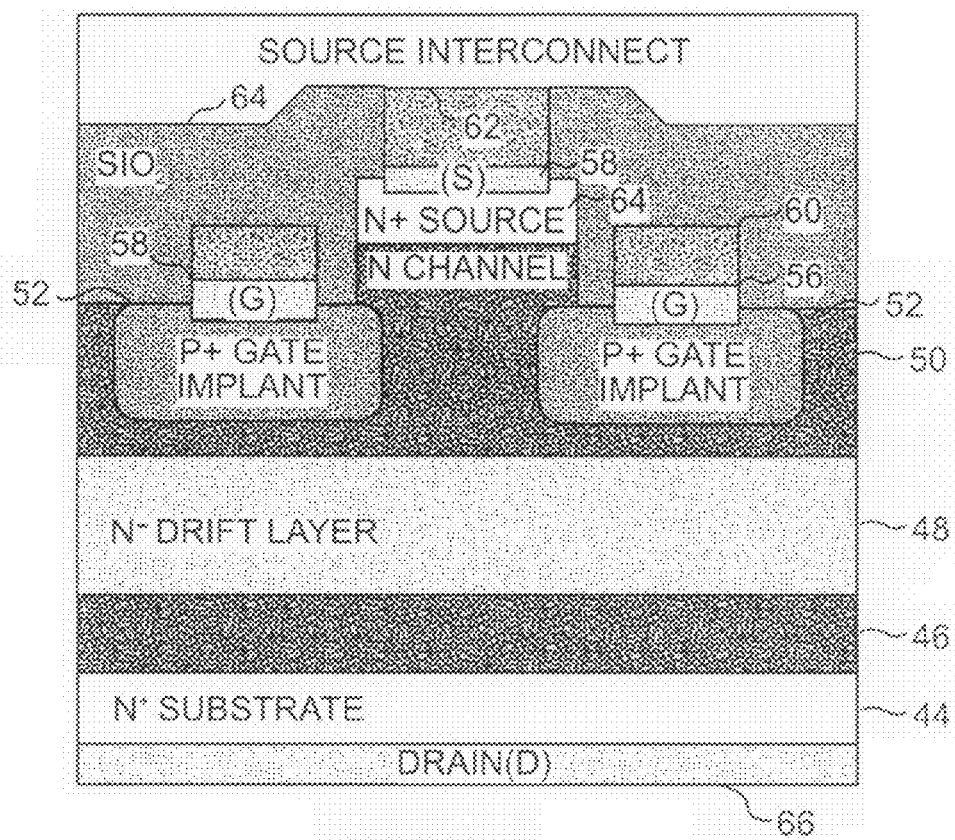
FIG. 4 is a central cross-sectional view further illustrative of a vertical junction field effect transistor such as shown in FIGS. 3A and 3B.

For illustrative purposes, FIG. 4 demonstrates one possible embodiment of the construction of a vertical JFET device. FIG. 4 depicts a more detailed cross section of a vertical JFET. As shown, the device is comprised of a multi-layered semiconductor structure which includes an N+ substrate 44, an N+ buffer layer 46, and N-drift layer 48 which combine to make up the drift regions 34 and 42 shown in FIGS. 3A and 3B, respectively. On top of the N-drift layer 48 there is formed an N-channel layer 50 which corresponds to the N-channel layers 30 and 38 of JFETs 24 and 26 and in which a P+ gate implant region 52 is fabricated and corresponds to the gate regions 32 and 40 shown in FIGS. 3A and 3B, respectively. An N+ source region 54 is formed on the top surface of the N-channel layer 50. Gate and source metallization layers 56 and 58 together with electrical interconnect elements 60 and 62 are formed on the top surfaces of the P+ gate implant region 52 and the N+ source region 54 and which is followed by an overlaying dielectric layer 64 with vias open over the gate and source interconnects 60 and 62. Finally, a layer 66 of metallization is applied to the outer surface of the N+ substrate 44 so as to provide a drain electrode.

Figure 5:
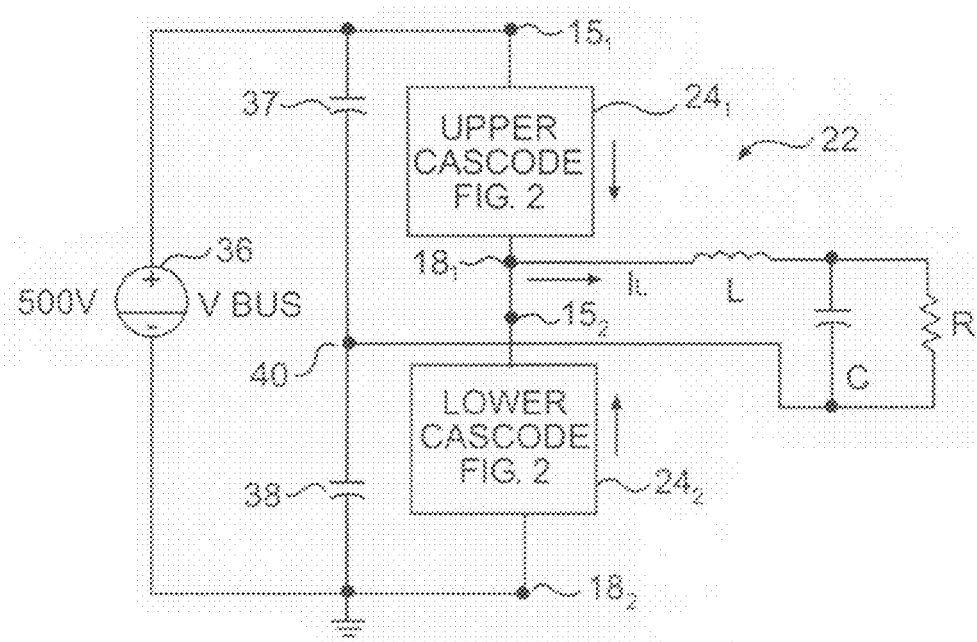
FIG. 5 is an electrical schematic diagram of a half-bridge inverter circuit including two cascode switch circuits shown in FIG. 2.

FIG. 5 is intended to disclose one possible application of the cascode circuits shown in FIG. 2. Referring now to FIG. 5, shown thereat is a half-bridge inverter circuit 28 which is comprised of two cascode JFET switches (FIG. 2) and identified by reference numerals $24_1$ and $24_2$ and which is operable to block 500 volts DC while conducting ~2 amps in both directions. Where, for example, sinusoidal pulsewidth modulation is used as a control algorithm and the cascode circuits $24_1$ and $24_2$ are coupled across a 500 VDC voltage bus 36 along with a pair of capacitors 37 and 38, the cascode switches $24_1$ and $24_2$ alternately turn ON and OFF such that when the upper cascode circuit $24_1$ is ON, the lower cascode circuit $24_2$ is OFF, and vice versa. A unidirectional load current $I_L$ of up to 2 amps flows through a load circuit consisting of an inductance L, a capacitance C and a load resistor R and which are shown connected between a common connection between the drain and source terminals $18_1$ and $15_2$ and where a return circuit connection is made to a circuit node 40 between the capacitors 37 and 38.

Figure 6:
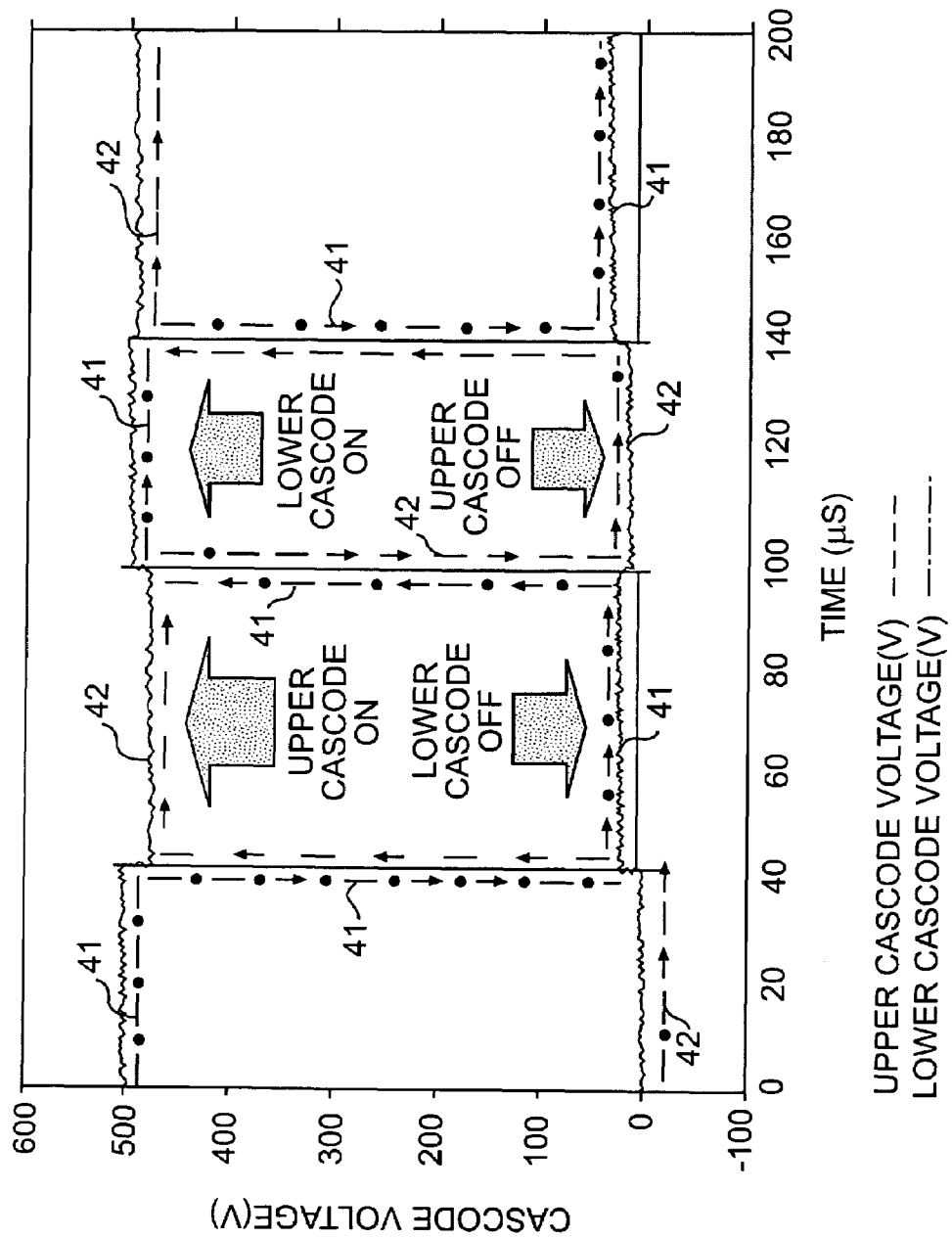
FIG. 6 is a set of voltage vs. time characteristic curves illustrative of the switching which takes place in the upper and lower cascode circuits shown in FIG. 5.

FIG. 6 is intended to show the voltage relationship between upper and lower cascode circuits 24₁ and 24₂ of FIG. 5 as they alternately turn ON and OFF. Voltage waveform 41, for example, depicts the lower cascode voltage, while reference numeral 42 denotes the upper cascode voltage appearing across the series inductance L and the parallel combination of the resistor R and the capacitor C.

Figure 7:
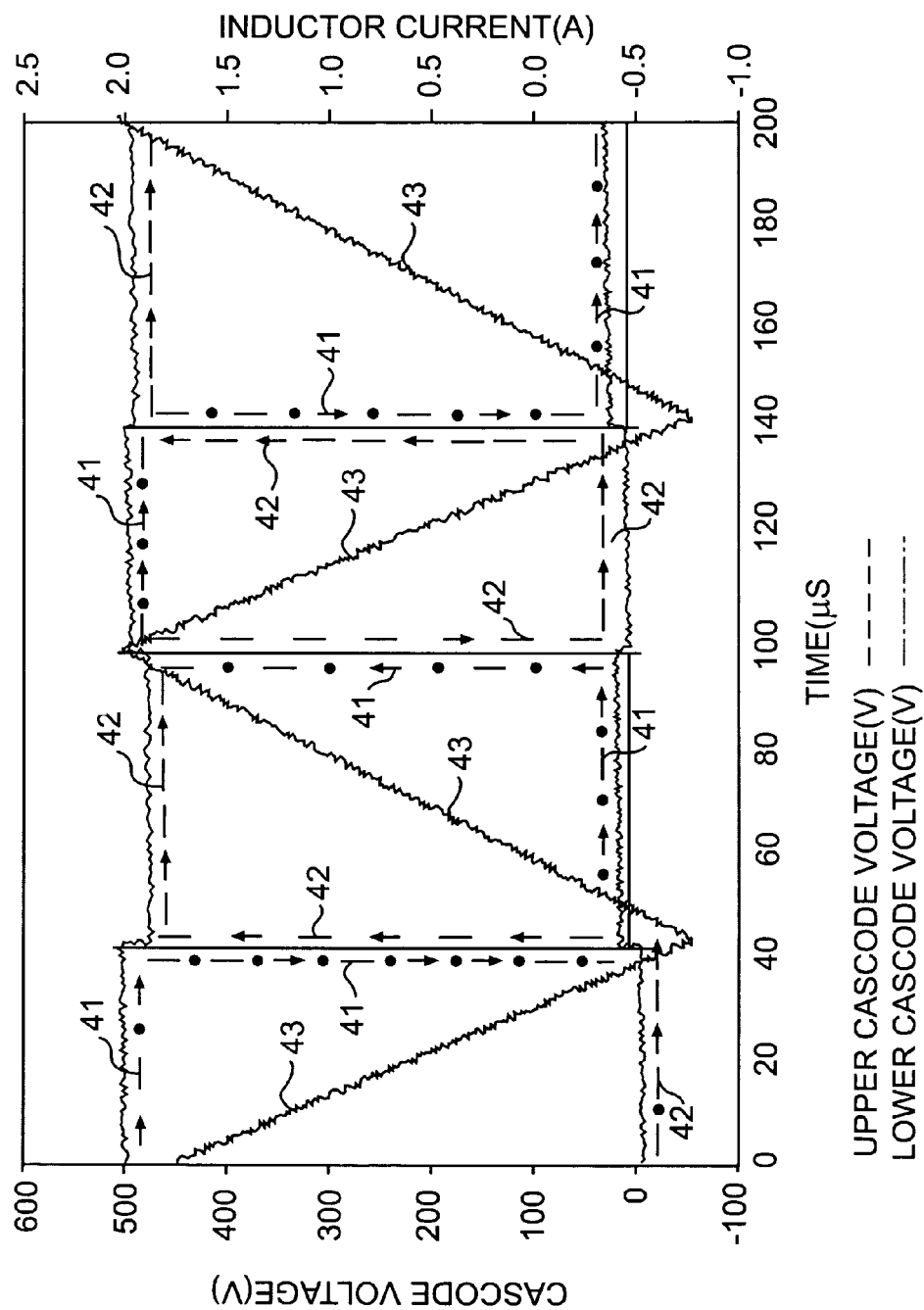
FIG. 7 is a voltage and current vs. time diagram of a half-bridge inverter illustrating the reverse conduction through the upper cascode circuit shown in FIG. 4, while the lower cascode circuit is in an OFF non-conducting state.

Referring now to FIG. 7, it is intended to show the output inductor current waveform 43 and the corresponding cascode switch voltage during the positive cycle of a 60 Hz inductor current ($I_L$) 43. The inductor current 43 free wheels in the reverse direction through the lower cascode circuit 24₂, demonstrating synchronous action in the cascode switch.

It should be noted that the normally-on HV and normally-off LV JFET structures 24 and 26 shown in FIGS. 3A and 3B, respectively, are fabricated with N type drift layers 34 and 42, and N type channel layers 30 and 38 between P+ gate regions 32 and 40, respectively. The JFET devices 24 and 26 are typically fabricated on different wafers with different thickness of epitaxial growth to optimize the on-resistance/blocking-voltage tradeoff. However, the devices 24 and 26 can be integrated to form a single device, when desirable, and still have the properties described above. It should also be noted that since the integral pn diodes do not turn on until about 2.5 volts in silicon carbide (SiC) as opposed to about 0.7 volts in silicon (Si), synchronous action can be achieved more easily and a possible greater power density can be achieved.

Figure 8:
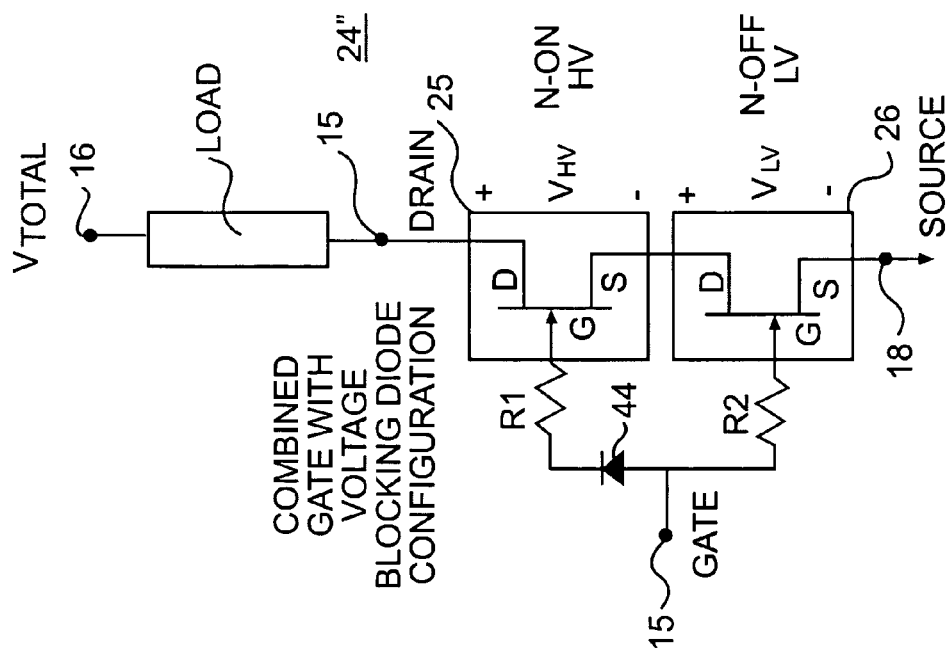
FIG. 8 is an electrical schematic diagram illustrative of another preferred embodiment of the subject invention consisting of a combined gate configuration.
Figure 9:
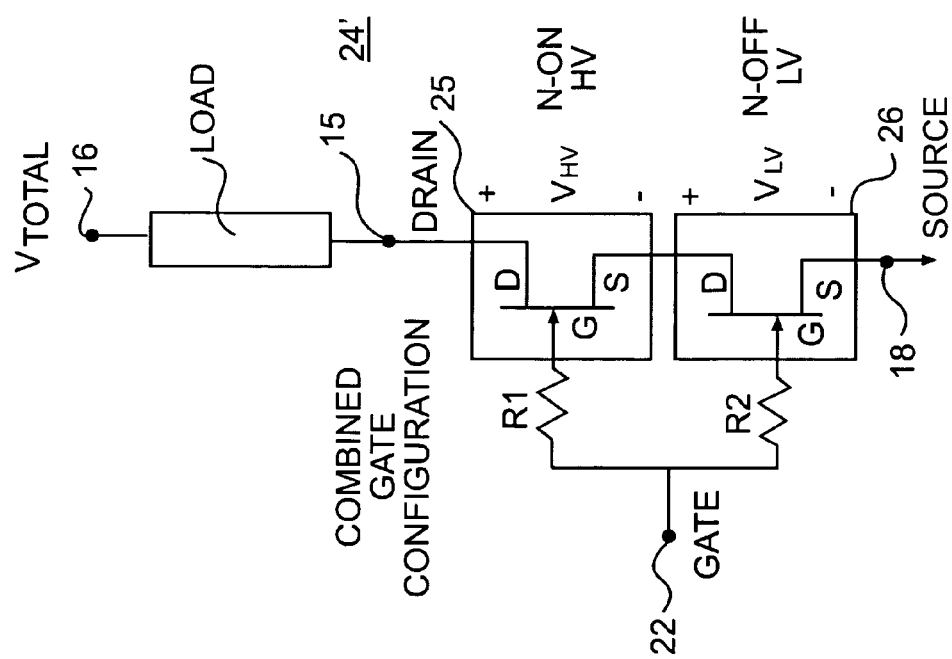
FIG. 9 is an electrical schematic diagram illustrative of yet another preferred embodiment of the subject invention including cascaded high voltage and low voltage JFET devices including a combined gate and voltage blocking diode.

Referring now to FIGS. 8 and 9, shown thereat are two additional circuit topologies for cascode power switches 24' and 24" that enable increased blocking voltage and lower specific on-resistance over the cascode power switch 10 shown in FIG. 1. By using SiC-JFETs 24 as the normally-on high voltage (HV) device, one can also obtain low values of $R_{on}$ on the entire cascode circuitry shown in FIG. 2, while simultaneously acquiring a high blocking voltage. By using wide bandgap material, such as SiC, for example, an order of magnitude increase in the blocking voltage layer doping density and a decrease in the blocking voltage layered thickness by about 1/10 results due to the fact that the breakdown electric field of SiC is 10× higher than that of silicon, hence yielding relatively lower $R_{on}$ values for the normally-on JFET 24.

Figure 10:
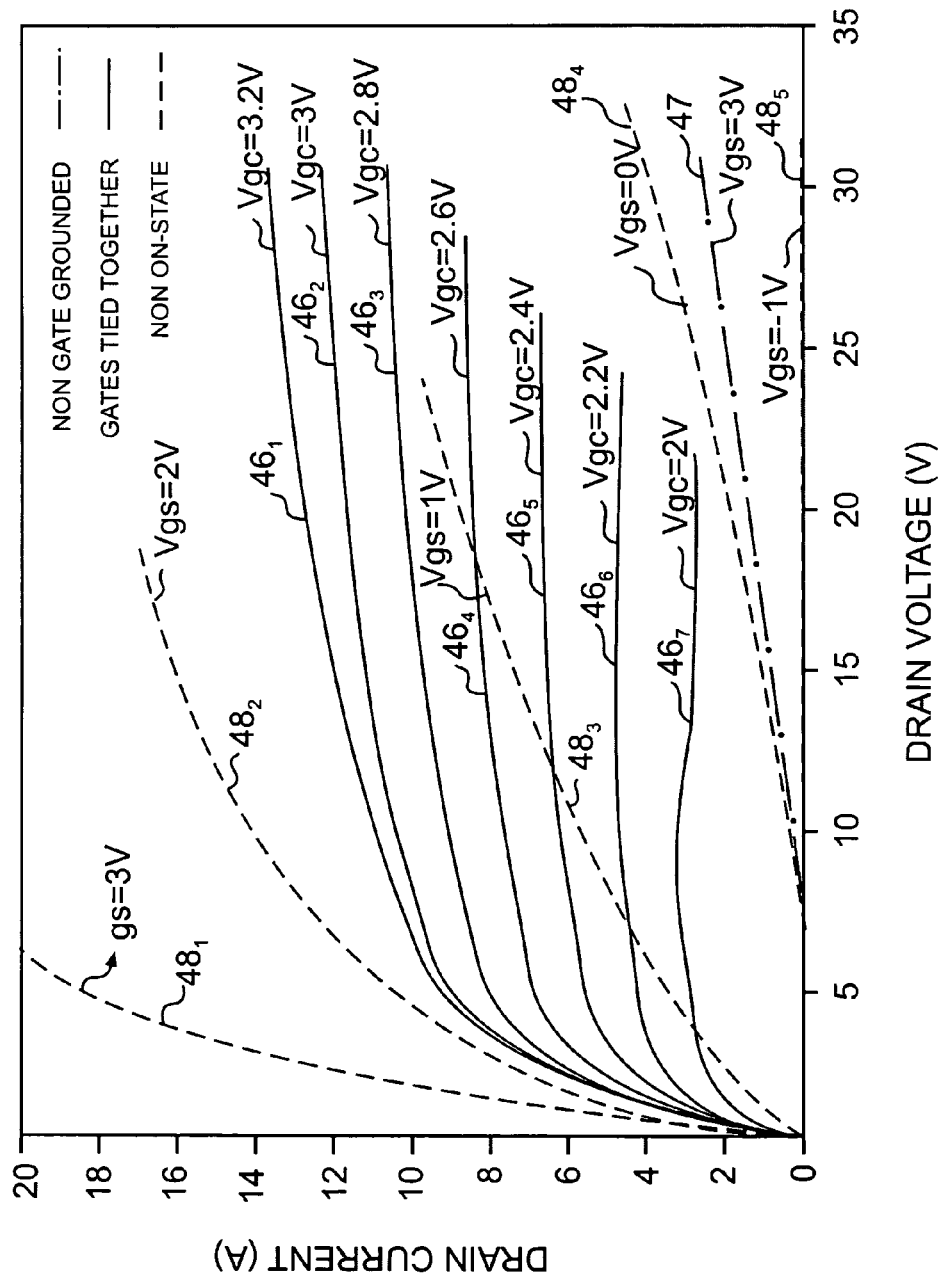
FIG. 10 is a set of characteristic curves further helpful in understanding the subject invention.

The cascode circuit configuration shown in FIGS. 2, 8 and 9 have been investigated and characteristic curves shown have been obtained as shown in FIG. 10. It has been found that the bias on the gate-source junction of the normally-on JFET 24 of cascode switch circuit 22 shown in FIG. 2 directly affects the output characteristics of the circuit. The output capability can be limited because of two primary potential problems. First, when the normally-on JFET 24 is designed to have a large voltage gain in order to block high voltages, the conductance can be lower than desirable. A second problem arises due to the topology of the cascode switch shown in FIG. 2 where the on-state voltage drop across the normally-off low voltage JFET 26 applies a negative bias on the gate-source junction of the normally-on JFET 24. For example, in a forward bias operation where $V_{gs}$>0 of FIG. 2, the ideal voltage drop across the normally-off JFET 26 is approximately 1.0 volt. Therefore, the gate-source bias of the normally-on device 24 is suppressed and is about $V_{gs}$=−1V.

Accordingly, it was found that the output characteristics of the cascode power switch could be further improved by a circuit configuration such as shown in FIG. 8. FIG. 8 is similar to the circuit in FIG. 2; however, the gate electrodes of the low voltage and high voltage JFET devices 25 and 26 are now tied together and connected to gate terminal 22 through only parasitic resistances R1 and R2. The high voltage and low voltage JFETs 25 and 26 can be matched, however, so that the turn-on of the gate-source junction of one device is not clamped to gate voltage applied to the cascode circuit. Thus the two JFETs 25 and 26 can be screened and selected in order to provide maximum output characteristics.

It should be pointed out, however, that the circuit configuration of FIG. 8 still maintains a normally-off condition when the gate bias applied to gate terminal 22 goes to zero. A device is considered to be normally-off when a gate voltage must be applied to turn the device ON, because a conductive channel between the source and drain does not exist at zero gate bias, i.e., Ids=0 at $V_{gs}$=0 for N channel devices. Since a low voltage, normally-off JFET meets this requirement, the entire cascode circuit 24' operates as a normally-off switch. It is important to note that gate resistors $R_1$ and $R_2$, may be additional resistances, either integrated or discrete elements, that can be used to implement current sharing between the JFET devices 25 and 26.

A third embodiment of the subject invention is shown in FIG. 9 and includes a series connected diode 44 in the gate terminal connection to the high voltage JFET 25 together with resistor R1. For high voltage applications using JFET devices with high reverse gate-source leakage current, the diode 44 serves to limit this leakage current and increase the cascode blocking voltage to that of the high voltage normally-on JFET 25. A diode 44 with a relatively small voltage drop is preferred, for example, a Schottky diode, in the topology of FIG. 9 in order to maximize the gate bias of the high voltage JFET 25. Moreover, for high temperature applications a silicon carbide Schottky diode is preferable. If it is desired to increase cascode circuit blocking voltage still further, such as greater-than 8-10 kV, stacking of several normally-on JFETs 25 can provide a possible solution where the diode 44 aides in voltage sharing among the stacked JFETs 25.

The implementation of the circuitry described herein for the embodiments of the cascode power switches can be achieved at the packaging level using well known wire bonding and trace routing techniques. Also, the circuit topologies can be implemented in integrated cascode structure, and the gate connections can be made using interconnect metal during the fabrication or wire bonding process.

Returning again to FIG. 10, the characteristic curves shown result from measured data obtained from the same high gain normally-on and normally-off JFET devices included in the circuits shown in FIGS. 2 and 8 and where only the gate connection is changed between measurements. It can be seen from the curves 47 of FIG. 10 that biasing the gate of the normally-on JFET device 24 of FIG. 2 to ground limits the amount of drain current for a given die area. The curves 46₁, 46₂, ... 46₇ for a cascode circuit of the embodiment shown in FIG. 8, indicates that with both gates tied together approach the limiting case of the normally-on device output alone (curves 48₁, 48₂, 48₃, 48₄ and 48₅).

Furthermore, the cascode circuit performance can be improved yet again by paralleling a plurality of normally-off JFET devices 26 in the bottom portion of the cascode circuit shown in FIG. 2 or 8 to lower the on-state resistance of the low voltage device and hence lower the voltage drop across the normally-off section of the cascode circuit 22 or 24', respectively.

Thus by using silicon carbide and JFET/SIT device technology, the cascode power switch embodiments depicted in FIGS. 2, 8 and 9 provide three distinct benefits: (1) the JFET/SIT technology coupled with the wide energy bandgap of SiC allows for higher temperature operability than that of silicon MOSFET type devices; (2) the higher breakdown electric field in SiC allows for a low $R_{ON}$ in both the normally-off JFET device 26 and the normally-on JFET device 25; and (3) the elimination of the low voltage silicon MOSFET greatly reduces the gate capacitance of the cascode circuit.

The foregoing detailed description is intended merely to illustrate the principles of the invention. It will thus be appreciated that those skilled in the art will be able to devise various arrangements which, although not explicitly described or shown therein, nevertheless embody the principles of the invention and are thus within its spirit and scope.

The invention claimed is:

1. A semiconductor power switch, comprising:
a first and a second electronically controlled semiconductor device, each having a pair of current conducting electrodes and a control electrode, wherein said pair of current conducting electrodes of both said first and second semiconductor devices are connected in cascode circuit relationship, wherein one of said semiconductor devices is in a normally-on conductive state (depletion mode), and the other of said semiconductor devices is in a normally-off conductive state (enhancement mode), and wherein a current conduction control signal is applied to the control electrode of said normally-off semiconductor device and wherein the control electrodes of said first and second semiconductor devices are commonly connected together to a control signal terminal.

2. The semiconductor power switch according to claim 1 wherein said first and second semiconductor devices comprise same type semiconductor devices.

3. The semiconductor power switch according to claim 2 wherein said first and second same type semiconductor devices are comprised of wide bandgap semiconductor devices.

4. The semiconductor power switch according to claim 3 wherein said semiconductor devices are comprised of silicon carbide (SiC) devices and/or gallium nitride (GaN) devices.

5. The semiconductor power switch according to claim 4 wherein semiconductor devices are comprised of junction gated transistors.

6. The semiconductor power switch according to claim 5 wherein the junction gated transistors include junction field effect transistors (JFETs), static induction transistors (SITs), or metal semiconductor field effect transistors (MESFETs).

7. The semiconductor power switch according to claim 6 wherein said JFETs, SITs, or MESFETs include an intermediate channel region of semiconductor material between a source and a drain region and a gate region adjacent to the intermediate channel region.

8. The semiconductor power switch according to claim 6 wherein the spacing between the gate regions of a normally-on junction gated transistor is greater than the spacing between the gate regions of said normally-off junction gated transistor.

9. The semiconductor power switch according to claim 8 wherein the channel region comprises a first type semiconductivity region, and the gate region comprises of a second type semiconductivity region.

10. The semiconductor power switch according to claim 9 wherein said first type semiconductivity region comprises n-type semiconductivity region and the second type semiconductivity region comprises p-type semiconductivity region.

11. The semiconductor power switch according to claim 9 wherein the channel region comprises a non-homogeneous doped region.

12. The semiconductor power switch according to claim 11 wherein the channel region comprises a plurality of semiconductivity layers of mutually different doping concentrations.

13. The semiconductor power switch according to claim 12 wherein the channel region is comprised of at least two dopants.

14. The semiconductor power switch according to claim 13 wherein the doping concentration of the drift region is lower than or equal to the doping concentration in the channel, source, or drain regions.

\* \* \* \* \*